United States Patent
Wang

(10) Patent No.: US 12,133,448 B2
(45) Date of Patent: Oct. 29, 2024

(54) ORGANIC LIGHT EMITTING DISPLAY PANEL INCLUDING METAL NANOPARTICLE LAYER CONFIGURED TO ABSORB ULTRAVIOLET RAYS, AND MANUFACTURING METHOD THEREOF

(71) Applicants: Wuhan China Star Optoelectronics Technology Co., Ltd., Wuhan (CN); Wuhan China Star Optoelectronics Semiconductor Display Technology Co., Ltd., Wuhan (CN)

(72) Inventor: Qile Wang, Wuhan (CN)

(73) Assignees: Wuhan China Star Optoelectronics Technology Co., Ltd., Wuhan (CN); Wuhan China Star Optoelectronics Semiconductor Display Technology Co., Ltd., Wuhan (CN)

(*) Notice: Subject to any disclaimer, the term of this patent is extended or adjusted under 35 U.S.C. 154(b) by 0 days.

(21) Appl. No.: 17/423,608

(22) PCT Filed: May 31, 2021

(86) PCT No.: PCT/CN2021/097251
§ 371 (c)(1),
(2) Date: Jul. 16, 2021

(87) PCT Pub. No.: WO2022/241829
PCT Pub. Date: Nov. 24, 2022

(65) Prior Publication Data
US 2024/0032408 A1    Jan. 25, 2024

(30) Foreign Application Priority Data
May 17, 2021 (CN) .......................... 202110533868.8

(51) Int. Cl.
*H10K 59/80* (2023.01)
*H10K 59/12* (2023.01)
(Continued)

(52) U.S. Cl.
CPC ..... *H10K 59/8793* (2023.02); *H10K 59/1201* (2023.02); *H10K 59/35* (2023.02);
(Continued)

(58) Field of Classification Search
CPC .. H10K 50/816; H10K 50/844; H10K 50/868; H10K 59/1201; H10K 59/35;
(Continued)

(56) References Cited

U.S. PATENT DOCUMENTS

2011/0132449 A1* 6/2011 Ramadas ............... B82Y 30/00
428/419

FOREIGN PATENT DOCUMENTS

CN    102057750 A    5/2011
CN    106450026 A  * 2/2017
(Continued)

*Primary Examiner* — Matthew E. Gordon
(74) *Attorney, Agent, or Firm* — Nathan & Associates; Menachem Nathan

(57) ABSTRACT

The embodiments of the present application disclose an organic light emitting display panel and a manufacturing method thereof. The organic light emitting display panel includes an organic light emitting diode layer and a metal nanoparticle layer. The metal nanoparticle layer is disposed on a side of the organic light emitting diode layer in contact with external environment, wherein metal nanoparticles of the metal nanoparticle layer can use their own surface plasmon resonance absorption effect to absorb ultraviolet rays emitted from external environment to the organic light emitting diode layer, thereby preventing ultraviolet rays from irradiating the organic light emitting diode layer.

19 Claims, 5 Drawing Sheets

(51) Int. Cl.
*H10K 59/35* (2023.01)
*H10K 102/00* (2023.01)

(52) U.S. Cl.
CPC ..... *H10K 59/80517* (2023.02); *H10K 59/873* (2023.02); *H10K 2102/331* (2023.02); *H10K 2102/351* (2023.02)

(58) Field of Classification Search
CPC .......... H10K 59/80517; H10K 59/873; H10K 59/8793; H10K 71/00; H10K 2102/331; H10K 2102/351
USPC .......................................................... 257/40
See application file for complete search history.

(56) References Cited

FOREIGN PATENT DOCUMENTS

| | | | | |
|---|---|---|---|---|
| CN | 108598285 A | | 9/2018 | |
| CN | 110311052 A | * | 10/2019 | ........... G06F 3/0412 |
| CN | 111864092 A | * | 10/2020 | ........... H01L 27/322 |
| WO | 2020183585 A1 | | 9/2020 | |

* cited by examiner

ORGANIC LIGHT EMITTING DISPLAY PANEL INCLUDING METAL NANOPARTICLE LAYER CONFIGURED TO ABSORB ULTRAVIOLET RAYS, AND MANUFACTURING METHOD THEREOF

FIELD OF INVENTION

The present application relates to a field of display technology and more particularly to an organic light emitting display panel and a manufacturing method thereof.

BACKGROUND OF INVENTION

Currently, organic light emitting diode (OLED) displays have become a focus of the display panel field at home and abroad due to characteristics of self-luminescence, high efficiency, wide color gamut, low energy consumption, bendability, and so on. Moreover, OLED displays have been applied to more and more fields of consumer electronics, such as mobile phones, tablets, in-vehicle control, electronic tags, smart audio, and other technological products, and their application boundary is continuously expanding and potential is constantly being tapped. However, along with continuous improvement of consumers' pursuit of display quality, some problems have also been reflected and exposed accompany.

Since core light-emitting and carrier transport layers of OLED devices are made of organic materials which are prone to aging, such as prone to degradation and cross-linking, etc., after being exposed to ultraviolet radiation under long time exposure to sunlight, this results in decreased luminous efficiency and reduced lifespan of OLED devices, which seriously affect performance and quality of the OLED devices.

Therefore, how to solve the technical problems of the core light-emitting and carrier transport layers of OLED devices which are prone to aging by ultraviolet radiation is a difficulty that current manufacturers of display panels need to work hard to overcome.

SUMMARY OF INVENTION

The embodiments of the present application provide an organic light emitting display panel and a manufacturing method thereof, to solve the technical problems of the core light-emitting and carrier transport layers of OLED devices which are prone to aging by ultraviolet radiation.

The embodiments of the present application provide an organic light emitting display panel, characterized in that comprising an organic light emitting diode layer and a metal nanoparticle layer, wherein the organic light emitting diode layer includes a first surface and a second surface oppositely disposed, the metal nanoparticle layer is disposed on a side of the organic light emitting diode layer close to the first surface, and the metal nanoparticle layer is insulated from the organic light emitting diode layer.

Optionally, in some embodiments of the present application, the organic light emitting display panel further including a polarizer disposed on the first surface;

wherein the metal nanoparticle layer is disposed on a side of the polarizer away from the organic light emitting diode layer.

Optionally, in some embodiments of the present application, the organic light emitting display panel further including a light-transmitting layer disposed on the side of the polarizer away from the organic light emitting diode layer;

wherein the metal nanoparticle layer is disposed on a side of the light-transmitting layer away from the organic light emitting diode layer.

Optionally, in some embodiments of the present application, the organic light emitting display panel further including a light-transmitting layer disposed on the side of the polarizer away from the organic light emitting diode layer;

wherein the metal nanoparticle layer is disposed in the light-transmitting layer.

Optionally, in some embodiments of the present application, a thickness of the light-transmitting layer ranges from 20 nanometers to 40 nanometers.

Optionally, in some embodiments of the present application, the organic light emitting display panel further including an encapsulation layer disposed on the side of the light-transmitting layer away from the organic light emitting diode layer;

wherein the metal nanoparticle layer is disposed on a side of the encapsulation layer away from the organic light emitting diode layer.

Optionally, in some embodiments of the present application, the organic light emitting display panel further including an encapsulation layer disposed on the side of the light-transmitting layer away from the organic light emitting diode layer;

wherein the metal nanoparticle layer is disposed in the encapsulation layer.

Optionally, in some embodiments of the present application, a thickness of the encapsulation layer ranges from 10 micrometers to 12 micrometers.

Optionally, in some embodiments of the present application, a material of the metal nanoparticle layer is selected from aluminum nanoparticle, copper nanoparticle, silver nano-ion, or zinc oxide nanoparticle.

Optionally, in some embodiments of the present application, a particle size of the aluminum nanoparticle ranges from 45.5 nanometers to 151.5 nanometers.

Optionally, in some embodiments of the present application, the organic light emitting diode layer includes an anode layer, a hole injection layer, a hole transport layer, a light emitting layer, an electron blocking layer, an electron transport layer, an electron injection layer, and a cathode layer;

wherein the cathode layer is disposed on a side of the polarizer away from the encapsulation layer, the electron injection layer is disposed on a side of the cathode layer away from the encapsulation layer, the electron transport layer is disposed on a side of the electron injection layer away from the encapsulation layer, the electron blocking layer is disposed on a side of the electron transport layer away from the encapsulation layer, the light emitting layer is disposed on a side of the electron blocking layer away from the encapsulation layer, the hole transport layer is disposed on a side of the light emitting layer away from the encapsulation layer, the hole injection layer is disposed on a side of the hole transport layer away from the encapsulation layer, and the anode layer is disposed on a side of the hole injection layer away from the encapsulation layer.

Optionally, in some embodiments of the present application, the anode layer includes a first indium tin oxide layer, a conductive metal layer, and a second indium tin oxide layer stacked in sequence, and wherein the second indium tin oxide layer is disposed on the side of the hole injection layer away from the encapsulation layer.

Optionally, in some embodiments of the present application, the light emitting layer includes a pixel light emitting layer and a cavity length adjustment layer; and wherein the pixel light emitting layer is disposed on the side of the electron blocking layer away from the encapsulation layer, and wherein the cavity length adjustment layer is disposed on a side of the pixel light emitting layer away from the encapsulation layer.

Optionally, in some embodiments of the present application, the pixel light emitting layer includes a red pixel light emitting layer, a green pixel light emitting layer, and a blue pixel light emitting layer; and wherein the red pixel light emitting layer, the green pixel light emitting layer, and the blue pixel light emitting layer are sequentially arranged at intervals.

Optionally, in some embodiments of the present application, the cavity length adjustment layer includes a red pixel cavity length adjustment layer, a green pixel cavity length adjustment layer, and a blue pixel cavity length adjustment layer; and wherein the red pixel cavity length adjustment layer is disposed opposite to the red pixel light emitting layer, the green pixel cavity length adjustment layer is disposed opposite to the green pixel light emitting layer, and the blue pixel cavity length adjustment layer is disposed opposite to the blue pixel light emitting layer.

The embodiments of the present application further provide a method of manufacturing an organic light emitting display panel, including:

providing an organic light emitting diode layer comprising a first surface and a second surface oppositely disposed;

forming a polarizer on a thin film transistor layer, the polarizer formed on the first surface;

forming a light-transmitting layer on a side of the polarizer away from the organic light emitting diode layer;

providing an organic light emitting diode layer comprising a first surface and a second surface oppositely disposed;

forming a metal nanoparticle layer on the first surface, and the metal nanoparticle layer is insulated from the organic light emitting diode layer.

Optionally, in some embodiments of the present application, the step of forming the metal nanoparticle layer on the polarizer includes:

coating a layer of metal nanoparticles on the first surface by spin coating process; and forming a metal nanoparticle layer by the metal nanoparticles.

Optionally, in some embodiments of the present application, the step of forming the metal nanoparticle layer on the polarizer includes:

vacuum vapor-depositing a layer of metal nanoparticles on the first surface by vacuum evaporation process; and forming the metal nanoparticle layer by the metal nanoparticles.

Optionally, in some embodiments of the present application, the metal nanoparticle layer is made of aluminum nanoparticle, copper nanoparticle, silver nano-ion or zinc oxide nanoparticle.

Optionally, in some embodiments of the present application, a particle size of the aluminum nanoparticle ranges from 45.5 nanometers to 151.5 nanometers.

In the organic light emitting display panel and the manufacturing method thereof provided by the embodiments of the present application, a metal nanoparticle layer is disposed on a side of the organic light emitting diode layer which is in contact with external environment. The metal nanoparticles of the metal nanoparticle layer can use their surface plasmon resonance absorption effect to absorb the ultraviolet rays emitted from the external environment to the organic light emitting diode layer, thereby preventing ultraviolet rays from irradiating core light emitting and carrier transport layers of the organic light emitting diode layer, thereby achieving the function of resisting solar radiation, achieving the effect of preventing the luminous efficiency and the lifespan of the organic light emitting display panel from decreasing, and improving the performance and quality of the organic light emitting display panel.

DESCRIPTION OF FIGURES

The following detailed description of specific implementations of the present application in conjunction with the accompanying figures will make the technical solutions and other beneficial effects of the present application obviously.

DETAILED DESCRIPTION OF EMBODIMENTS

The technical solutions in some embodiments of the present application will be clearly and completely described below in conjunction with the figures in some embodiments of the present application. Obviously, the described embodiments are only a part of the embodiments of the present application, rather than all the embodiments. Based on the embodiments in the present application, all other embodiments obtained by those skilled in the art without inventive steps shall fall within the protection scope of the present application.

In the description of the present application, it needs to be understood that the orientation or positional relationship indicated by the terms "length", "width", "thickness", "upper", "lower", etc. are based on the positional or positional relationship shown in the figures. It is only for the convenience of describing the present application and simplifying the description, and does not indicate or imply that the device or element referred to must have a specific orientation, be constructed and operated in a specific orientation, and therefore cannot be understood as a limitation of the present application. In the description of the present application, "multiple" means two or more than two, unless otherwise specifically defined.

In the present application, unless expressly stipulated and defined otherwise, the "above" or "below" of the first feature of the second feature may include direct contact between the first and second features, or may include the first and second features not in direct contact but through other features between them.

The embodiments of the present application provide an organic light emitting display panel and a manufacturing method thereof. Detailed descriptions are provided below. It should be noted that an order of description in the following embodiments is not meant to limit a preferred order of the embodiments.

Figure 1:
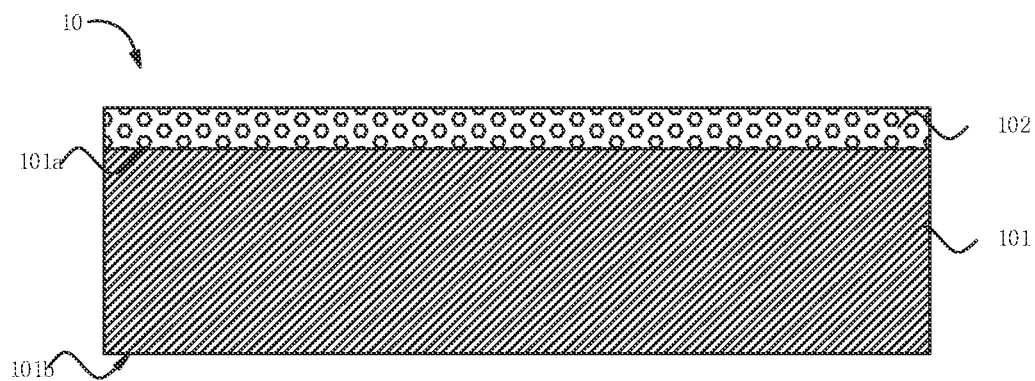
FIG. 1 is a schematic diagram of a first structure of an organic light emitting display panel provided by one embodiment of the present application.

Specifically, please refer to FIG. 1. FIG. 1 is a schematic diagram of a first structure of an organic light emitting display panel 10 provided by one embodiment of the present application. The organic light emitting display panel 10 provided by this embodiment of the present application includes an organic light emitting diode layer 101 and a metal nanoparticle layer 102. The organic light emitting diode layer 101 includes a first surface 101a and a second surface 101b oppositely disposed, the metal nanoparticle layer 102 is disposed on a side of the organic light emitting diode layer 101 close to the first surface 101a, and the metal nanoparticle layer 102 is insulated from the organic light emitting diode layer 101.

A material of the metal nanoparticle layer 102 is metal nanoparticle.

It should be noted that due to huge surface area of the metal nanoparticles, plasmon resonance of a partial surface of the metal nanoparticles has a strong field enhancement effect. When sunlight is incident on a surface of the metal nanoparticle layer 102, and when a frequency of the incident light is the same as a plasma oscillation rate of the metal nanoparticles, the partial surface plasmon resonance absorber of metal nanoparticles will resonate with the incident light and generate strong high temperature hot spots, and transfer energy to the surrounding medium in a very short time. The hot spot acts as a heat source to drive the surrounding medium to rapidly vaporize phase change, which can convert electromagnetic energy into heat energy in the very short time, so that the metal nanoparticles absorb the incident light. Wherein, the types of metal nanoparticles can be changed to absorb light of different spectra.

In one embodiment, a material of the metal nanoparticle layer 102 is selected from aluminum nanoparticle, copper nanoparticle, silver nano-ion, or zinc oxide nanoparticle. The specific material of the metal nanoparticle layer 102 is determined according to a specific process requirements of the organic light emitting display panel 10.

It should be noted that by disposing the metal nanoparticle layer 102 which is selected from aluminum nanoparticle, copper nanoparticle, silver nano-ion, or zinc oxide nanoparticle, the metal nanoparticle layer 102 can absorb light with a wavelength of less than 400 nanometers, that is, the metal nanoparticle layer 102 can absorb most of the ultraviolet rays in the incident light, and at the same time does not affect a transmission of visible light of the incident light, and does not affect light emission of the organic light emitting display panel 10.

It should be noted that the metal nanoparticle layer 102 is disposed on a side of the organic light emitting diode layer 101 in contact with external environment. When an external light source transmits through the metal nanoparticle layer 102, the metal nanoparticle layer 102 absorbs ultraviolet rays of the external light source, and does not affect a transmission of visible light of the external light source. Therefore, ultraviolet rays are prevented from being irradiated to a core light emitting layer and a carrier transport layer of the organic light emitting diode layer 101, and normal light emission of the organic light emitting display panel 10 is not affected. Thereby, the metal nanoparticle layer 102 achieves a function of resisting solar radiation, and achieves an effect of preventing the luminous efficiency and the lifespan of the organic light-emitting display panel 10 from decreasing, thereby improving the performance and quality of the organic light-emitting display panel 10.

It should be noted that the organic light emitting diode layer 101 and the metal nanoparticle layer 102 are insulated so that the metal nanoparticle layer 102 will not affect light emitting characteristics of the organic light emitting diode layer 101.

Figure 2:
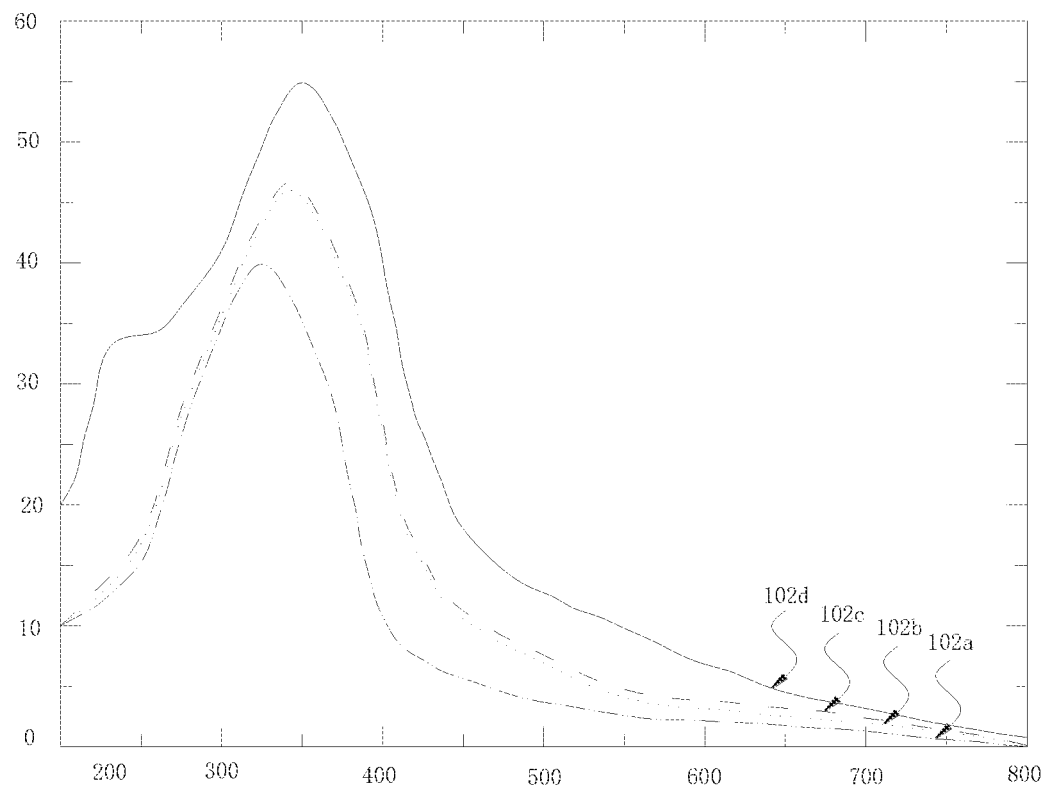
FIG. 2 is an absorption spectrum diagram of a metal nanoparticle layer of the organic light emitting display panel provided by one embodiment of the present application.

Specifically, please refer to FIG. 2, FIG. 2 is an absorption spectrum diagram of the metal nanoparticle layer 102 of the organic light emitting display panel 10 provided by one embodiment of the present application. Curve 102a is an absorption spectrum of the metal nanoparticle layer 102 when a particle size of each of the metal nanoparticles is 45.5 nanometers. Curve 102b is an absorption spectrum of the metal nanoparticle layer 102 when the particle size of each of the metal nanoparticles is 73.5 nanometers. Curve 102c is an absorption spectrum of the metal nanoparticle layer 102 when the particle size of each of the metal nanoparticles is 108.6 nanometers. Curve 102d is an absorption spectrum of the metal nanoparticle layer 102 when the particle size of each of the metal nanoparticles is 151.5 nanometers.

In one embodiment, the particle size of each of the metal nanoparticles in the metal nanoparticle layer 102 ranges from 45.5 nm to 151.5 nm, specifically, a thickness of the metal nanoparticle in the metal nanoparticle layer 102 is 45.5 nm, 59 nm, 73.5 nm, 86 nm, 108.6 nm, 130 nm, or 151.5 nm, wherein a specific particle size of the metal nanoparticle in the metal nanoparticle layer 102 is defined according a specific process requirements of the organic light emitting display panel 10.

It should be noted that, as can be seen from FIG. 2, as the particle size of the metal nanoparticle in the metal nanoparticle layer 102 increases, the metal nanoparticle layer 102 has a better absorption effect of ultraviolet rays of sunlight. However, at the same time, as the particle size of the metal nanoparticles in the metal nanoparticle layer 102 increases, the metal nanoparticle layer 102 has a better absorption effect of visible light of sunlight.

Therefore, in order to ensure the metal nanoparticle layer 102 absorbs as much ultraviolet rays and as little visible light of the sunlight as possible, the particle size of the metal nanoparticles in the metal nanoparticle layer 102 should be between 73.5 nm and 108.6 nm.

Figure 3:
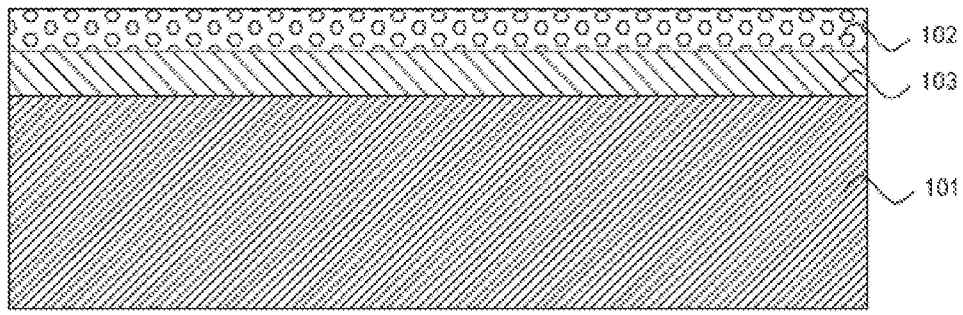
FIG. 3 is a schematic diagram of a second structure of the organic light emitting display panel provided by one embodiment of the present application.

Specifically, please refer to FIG. 3. FIG. 3 is a schematic diagram of a second structure of the organic light emitting display panel 10 provided by one embodiment of the present application. A difference between the organic light emitting display panel 10 of FIG. 3 and the organic light emitting display panel 10 of FIG. 1 is: The organic light emitting display panel 10 of FIG. 3 further includes a polarizer 103 disposed on the first surface 101a, and the metal nanoparticle layer 102 is disposed on a side of the polarizer 103 away from the organic light emitting diode layer 101.

It should be noted that the metal nanoparticle layer 102 is disposed between the polarizer 103 and the light-transmitting layer 104.

First, the embodiment of FIG. 3 can prevent the metal nanoparticle layer 102 from being corroded by external environment which affects an ability of the metal nanoparticle layer 102 to absorb ultraviolet rays of sunlight. Second, the metal nanoparticle layer 102 is not in contact with the organic light emitting diode layer 101, so the metal nanoparticle layer 102 will not affect the light emitting characteristics of the organic light emitting diode layer 101.

In one embodiment, a thickness of the polarizer 103 ranges from 60 nm to 90 nm, specifically, a thickness of the polarizer 103 is 60 nm, 64 nm, 68 nm, 73 nm, 78 nm, 84 nm, or 90 nm, wherein a specific thickness of the polarizer 103 is defined according to the specific process requirements of the organic light emitting display panel 10.

Figure 4:
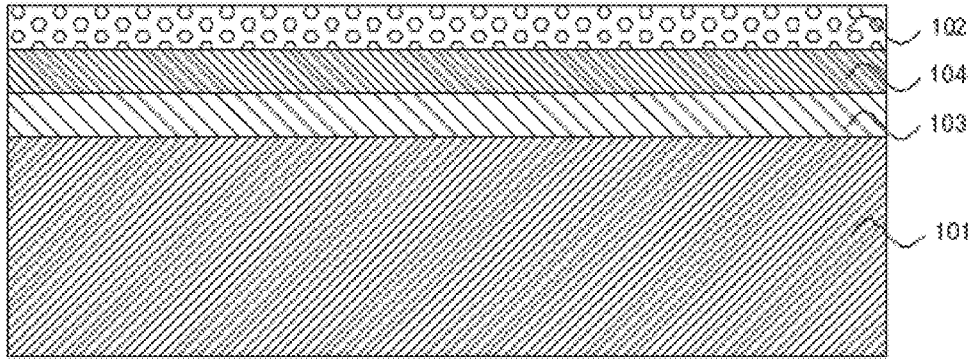
FIG. 4 is a schematic diagram of a third structure of the organic light emitting display panel provided by one embodiment of the present application.

Specifically, please refer to FIG. 4. FIG. 4 is a schematic diagram of a third structure of the organic light emitting display panel 10 provided by one embodiment of the present application. A difference between the organic light emitting display panel 10 of FIG. 4 and the organic light emitting display panel 10 of FIG. 3 is: The organic light emitting display panel 10 further includes a light-transmitting layer 104 disposed on the side of the polarizer 103 away from the organic light emitting diode layer 101, and the metal nanoparticle layer 102 is disposed on a side of the light-transmitting layer 104 away from the organic light emitting diode layer 101.

It should be noted that the metal nanoparticle layer 102 is disposed on the side of the light-transmitting layer 104 away from the organic light emitting diode layer 101.

First, the embodiment of FIG. 4 can prevent the metal nanoparticle layer 102 from being corroded by the external environment, which affects an ability of the metal nanoparticle layer 102 to absorb ultraviolet rays of sunlight. Second, the metal nanoparticle layer 102 is not in contact with the organic light emitting diode layer 101, so the metal nanoparticle layer 102 will not affect the light emitting characteristics of the organic light emitting diode layer 101.

In one embodiment, a material of the light-transmitting layer 104 is lithium fluoride.

In one embodiment, a thickness of the light-transmitting layer 104 ranges from 20 nm to 40 nm, specifically, the thickness of the light-transmitting layer 104 is 20 nm, 22 nm, 24 nm, 27 nm, 31 nm, 35 nm, or 40 nm, wherein a specific thickness of the light-transmitting layer 104 is defined according to the specific process requirements of the organic light emitting display panel 10.

Figure 5:
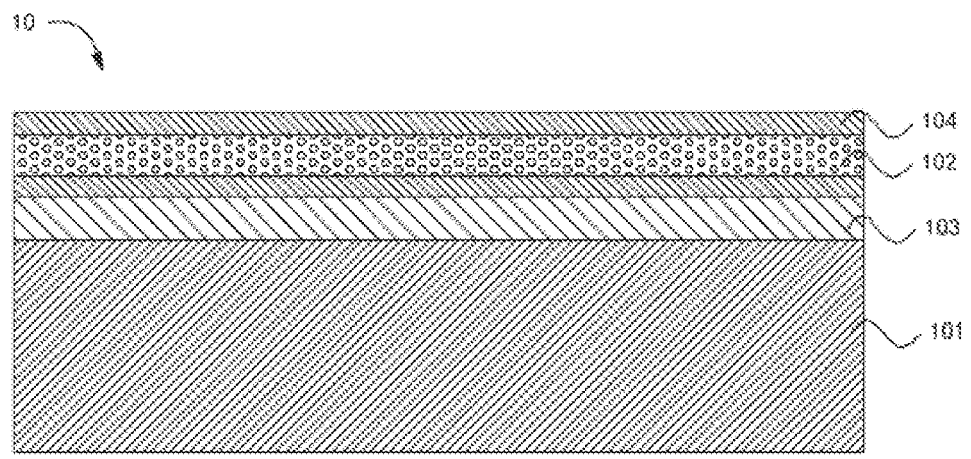
FIG. 5 is a schematic diagram of a fourth structure of the organic light emitting display panel provided by one embodiment of the present application.

Specifically, please refer to FIG. 5. FIG. 5 is a schematic diagram of a fourth structure of the organic light emitting display panel 10 provided by one embodiment of the present application. A difference between the organic light emitting display panel 10 of FIG. 5 and the organic light emitting display panel 10 of FIG. 3 is: The organic light-emitting display panel 10 provided in FIG. 5 further includes a light-transmitting layer 104 disposed on the side of the polarizer 103 away from the organic light emitting diode layer 10, and the metal nanoparticle layer 102 is disposed in the light-transmitting layer 104.

It should be noted that the metal nanoparticle layer 102 is disposed in the light-transmitting layer 104.

First, the embodiment of FIG. 5 can prevent the metal nanoparticle layer 102 from being corroded by the external environment, which affects an ability of the metal nanoparticle layer 102 to absorb ultraviolet rays in sunlight. Second, the metal nanoparticle layer 102 of the embodiment of FIG. 5 is not in contact with the organic light emitting diode layer 101, so the metal nanoparticle layer 102 will not affect the light emitting characteristics of the organic light emitting diode layer 101. Third, the metal nanoparticle layer 102 of the embodiment of FIG. 5 and the light-transmitting layer 104 can be integrally formed, which reduces a thickness of the organic light emitting display panel and saves process.

Figure 6:
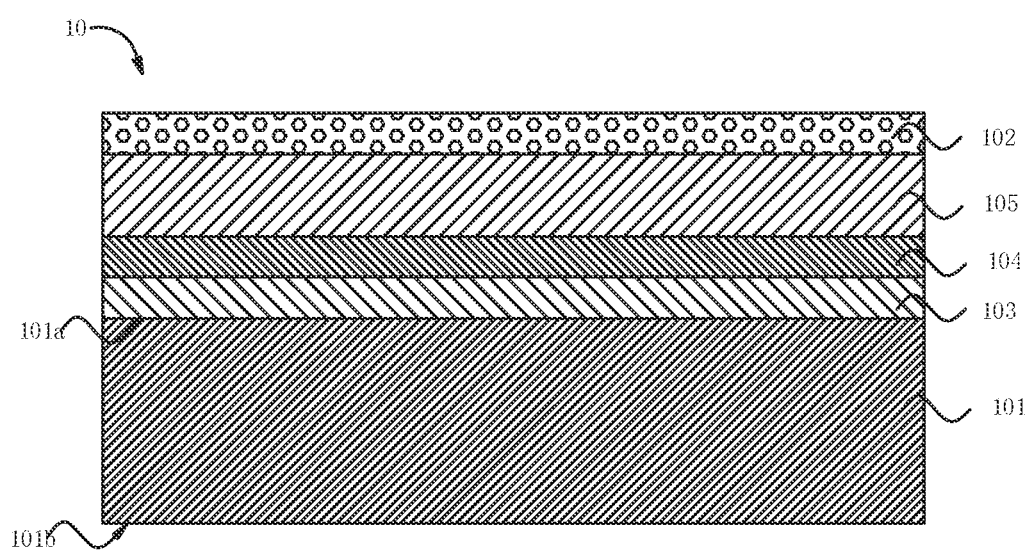
FIG. 6 is a schematic diagram of a fifth structure of the organic light emitting display panel provided by one embodiment of the present application.

Specifically, please refer to FIG. 6. FIG. 6 is a schematic diagram of a fifth structure of the organic light emitting display panel 10 provided by one embodiment of the present application. A difference between the organic light emitting display panel 10 of FIG. 6 and the organic light emitting display panel 10 of FIG. 4 is: The organic light emitting display panel 10 of FIG. 6 further includes an encapsulation layer 105 disposed on the side of the light-transmitting layer 104 away from the organic light emitting diode layer 101, and the metal nanoparticle layer 102 is disposed on a side of the encapsulation layer 105 away from the organic light emitting diode layer 101.

It should be noted that the metal nanoparticle layer 102 is disposed on the side of the encapsulation layer 105 away from the organic light emitting diode layer 101. The metal nanoparticle layer 102 is not in contact with the organic light emitting diode layer 101, so the metal nanoparticle layer 102 will not affect the light emitting characteristics of the organic light emitting diode layer 101.

In one embodiment, the material of the encapsulation layer 105 is selected from aluminum oxide, silicon oxide, silicon nitride, silicon oxynitride, silicon carbide, titanium oxide, zirconium oxide, zinc oxide, or tetrafluoroethylene. A specific material of the encapsulation layer 105 is defined according to the specific process requirements of the organic light emitting display panel 10.

In one embodiment, a thickness of the encapsulation layer 105 ranges from 10 micrometers to 12 micrometers. Specifically, the thickness of the encapsulation layer 105 is 10 micrometers, 10.2 micrometers, 10.4 micrometers, 10.7 micrometers, 11 micrometers, 11.5 micrometers, or 12 micrometers. The specific thickness of the encapsulation layer 105 is defined according to the specific process requirements of the organic light emitting display panel 10.

Figure 7:
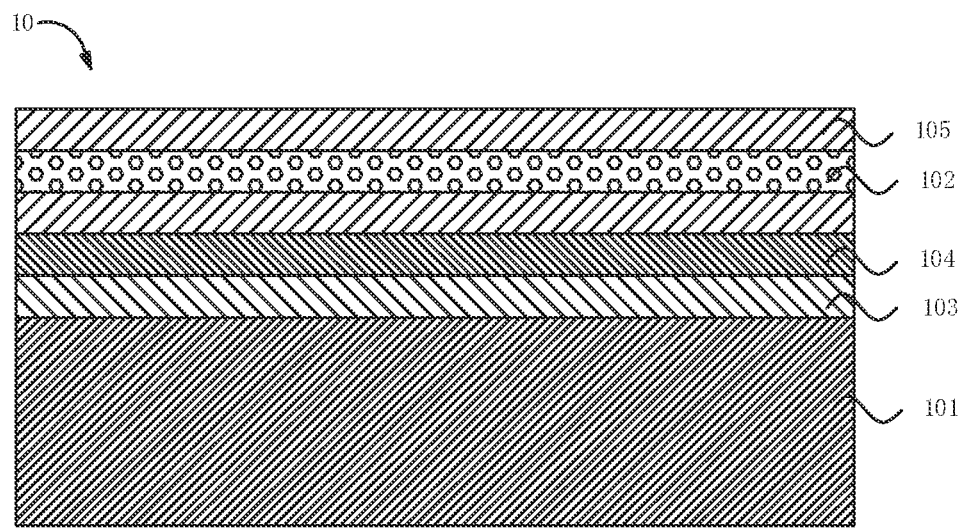
FIG. 7 is a schematic diagram of a sixth structure of the organic light emitting display panel provided by one embodiment of the present application.

Specifically, please refer to FIG. 7. FIG. 7 is a schematic diagram of a sixth structure of the organic light emitting display panel 10 provided by one embodiment of the present application. A difference between the organic light emitting display panel 10 of FIG. 7 and the organic light emitting display panel 10 of FIG. 4 is: The organic light emitting display panel 10 further includes an encapsulation layer 105 disposed on the side of the light-transmitting layer 104 away from the organic light emitting diode layer 101, and the metal nanoparticle layer 102 is disposed in the encapsulation layer 105.

It should be noted that the metal nanoparticle layer 102 is disposed in the encapsulation layer 105.

First, the embodiment provided in FIG. 7 can prevent the metal nanoparticle layer 102 from being corroded by the external environment, which affects the ability of the metal nanoparticle layer 102 to absorb ultraviolet rays in sunlight. Second, the metal nanoparticle layer 102 of FIG. 7 is not in contact with the organic light emitting diode layer 101, so the metal nanoparticle layer 102 will not affect the light emitting characteristics of the organic light emitting diode layer 101. Third, the metal nanoparticle layer 102 and the light-transmitting layer 104 of FIG. 7 can be integrally formed, which reduces the thickness of the organic light emitting display panel 10 and saves process.

Figure 8:
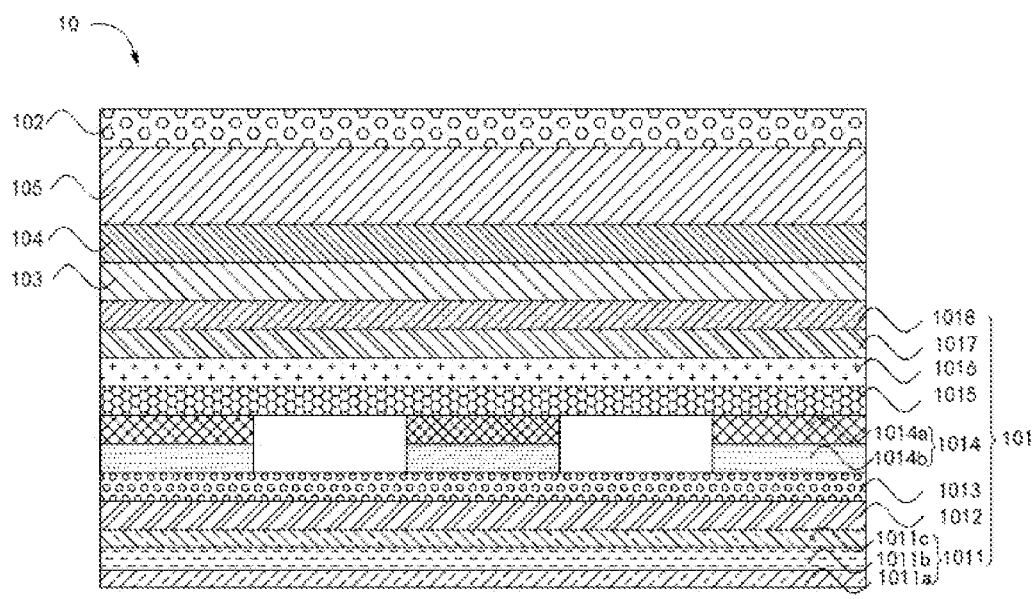
FIG. 8 is a schematic diagram of a seventh structure of the organic light emitting display panel provided by one embodiment of the present application.

Specifically, please refer to FIG. 8. FIG. 8 is a seventh structural diagram of the organic light emitting display panel 10 provided by one embodiment of the present application. A difference between the organic light emitting display panel 10 of FIG. 8 and the organic light emitting display panel 10 of FIG. 6 is: The organic light emitting diode layer 101 of FIG. 8 includes an anode layer 1011, a hole injection layer 1012, a hole transport layer 1013, a light emitting layer 1014, an electron blocking layer 1015, an electron transport layer 1016, an electron injection layer 1017, and a cathode layer 1018.

The cathode layer 1018 is disposed on a side of the polarizer 103 away from the encapsulation layer 105, the electron injection layer 1017 is disposed on a side of the cathode layer 1018 away from the encapsulation layer 105, the electron transport layer 1016 is disposed on a side of the electron injection layer 1017 away from the encapsulation layer 105, the electron blocking layer 1015 is disposed on a side of the electron transport layer 1016 away from the encapsulation layer 105, the light emitting layer 1014 is disposed on a side of the electron blocking layer 1015 away from the encapsulation layer 105, the hole transport layer 1013 is disposed on a side of the light emitting layer 1014 away from the encapsulation layer 105, the hole injection layer 1012 is disposed on a side of the hole transport layer 1013 away from the encapsulation layer 105, and the anode layer 1011 is disposed on a side of the hole injection layer 1012 away from the encapsulation layer 105.

The anode layer 1011 includes a first indium tin oxide layer 1011a, a conductive metal layer 1011b, and a second indium tin oxide layer 1011c stacked in sequence. The light emitting layer 1014 includes a pixel light emitting layer 1014a and a cavity length adjustment layer 1014b. The pixel light emitting layer 1014a includes a red pixel light emitting layer, a green pixel light emitting layer, and a blue pixel light emitting layer. The cavity length adjustment layer 1014b includes a red pixel cavity length adjustment layer, a green pixel cavity length adjustment layer, and a blue pixel cavity length adjustment layer. The red pixel light emitting layer, the green pixel light emitting layer, and the blue pixel light emitting layer are sequentially arranged at intervals. The red pixel cavity length adjustment layer is disposed opposite to the red pixel light emitting layer, and the red pixel cavity length adjustment layer is disposed on a side of the red pixel light emitting layer away from the encapsulation layer 105. The green pixel cavity length adjustment layer is disposed opposite to the green pixel light emitting layer, and the green pixel cavity length adjustment layer is disposed on a side of the green pixel light emitting layer away from the encapsulation layer 105. The blue pixel cavity length adjustment layer is disposed opposite to the blue pixel light emitting layer, and the blue pixel cavity length adjustment layer is disposed on a side of the blue pixel light emitting layer away from the encapsulation layer 105.

In one embodiment, a thickness of the cathode layer 1018 ranges from 9 nm to 13 nm. Specifically, the thickness of the cathode layer 1018 is 9 nm, 9.5 nm, 10 nm, 10.7 nm, 11.4 nm, 12.2 nm, or 13 nm. A specific thickness of the cathode layer 1018 is defined according to the specific process requirements of the organic light emitting display panel 10.

In one embodiment, a thickness of the electron injection layer 1017 ranges from 20 nm to 40 nm, specifically, the thickness of the electron injection layer 1017 is 20 nm, 22 nm, 24 nm, 27 nm, 31 nm, 35 nm, or 40 nm, wherein the specific thickness of the electron injection layer 1017 is defined according to the specific process requirements of the organic light emitting display panel 10.

In one embodiment, a thickness of the electron transport layer 1016 ranges from 40 nm to 60 nm, specifically, the thickness of the electron transport layer 1016 is 40 nm, 42 nm, 44 nm, 47 nm, 51 nm, 55 nm, or 60 nm, wherein the specific thickness of the electron transport layer 1016 is defined according to the specific process requirements of the organic light emitting display panel 10.

In one embodiment, a thickness of the electron blocking layer 1015 ranges from 10 nm to 20 nm. Specifically, the thickness of the electron blocking layer 1015 is 10 nm, 11 nm, 12 nm, 13.5 nm, 15.5 nm, 17.5 nm, or 20 nm, wherein the specific thickness of the electron blocking layer 1015 is defined according to the specific process requirements of the organic light emitting display panel 10.

In one embodiment, a thickness of the hole transport layer 1013 ranges from 120 nm to 130 nm. Specifically, the thickness of the hole transport layer 1013 is 120 nm, 121 nm, 122 nm, 123.5 nm, 125.5 nm, 127.5 nm, or 130 nm. The specific thickness of the hole transport layer 1013 is defined according to the specific process requirements of the organic light emitting display panel 10.

In one embodiment, a thickness of the hole injection layer 1012 ranges from 9 nm to 11 nm. Specifically, the thickness of the hole injection layer 1012 is 9 nm, 9.2 nm, 9.4 nm, 9.7 nm, 10.1 nm, 10.5 nm, or 11 nm. The specific thickness of the hole injection layer 1012 is defined according to the specific process requirements of the organic light emitting display panel 10.

In the organic light emitting display panel provided in the present application, a metal nanoparticle layer is disposed on a side of the organic light emitting diode layer which is in contact with the external environment. The metal nanoparticles in the metal nanoparticle layer can use their surface plasmon resonance absorption effect to absorb the ultraviolet rays emitted from the external environment to the organic light emitting diode layer, thereby preventing ultraviolet rays from irradiating the core light emitting and carrier transport layers of the organic light emitting diode layer. Therefore, the metal nanoparticle layer has the function of resisting solar radiation, and achieves the effect of preventing the luminous efficiency and the lifespan of the organic light emitting display panel from decreasing, thereby improving the performance and quality of the organic light emitting display panel.

Correspondingly, the embodiments of the present application provide a method of manufacturing the organic light emitting display panel.

Figure 9:
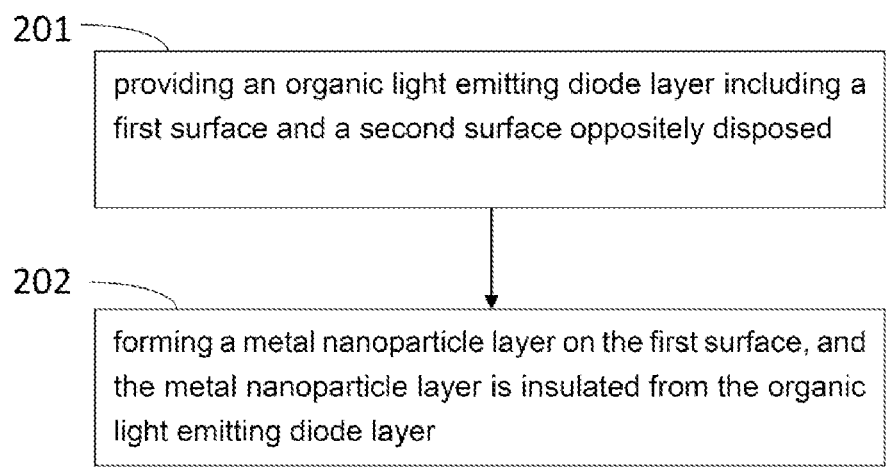
FIG. 9 is a schematic flowchart of a method of manufacturing the organic light emitting display panel provided by one embodiment of the present application.

Please refer to FIG. 9. FIG. 9 is a schematic flowchart of a method of manufacturing the organic light emitting display panel provided by one embodiment of the present application. The method of manufacturing the organic light emitting display panel provided by one embodiment of the present application includes:

201: providing an organic light emitting diode layer including a first surface and a second surface oppositely disposed.

202: forming a metal nanoparticle layer on the first surface, and the metal nanoparticle layer is insulated from the organic light emitting diode layer.

It should be noted that the step of forming the metal nanoparticle layer on the first surface includes: coating a layer of metal nanoparticles on the polarizer by spin coating process and forming a metal nanoparticle layer by the metal nanoparticles.

It should be noted that the spin coating process can be used to form the metal nanoparticle layer, wherein the manufacturing process of the spin coating is simple, and a cost of the manufacturing process of the spin coating is low.

It should be noted that the step of forming the metal nanoparticle layer on the polarizer may also be: vacuum vapor-depositing a layer of metal nanoparticles on the polarizer by vacuum evaporation process; and forming the metal nanoparticle layer by the metal nanoparticles.

It should be noted that the vacuum vapor-depositing process can be used to form the metal nanoparticle layer. The vacuum vapor-depositing process is configured to form the metal nanoparticle layer, which has better film quality and is more suitable for large-size display panels.

In the method of manufacturing the organic light emitting display panel provided in the present application, a metal nanoparticle layer is disposed on a side of the organic light emitting diode layer which is in contact with external environment. The metal nanoparticles of the metal nanoparticle layer can use their surface plasmon resonance absorption effect to absorb the ultraviolet rays emitted from the external environment to the organic light emitting diode layer, thereby preventing ultraviolet rays from irradiating core light emitting and carrier transport layers of the organic light emitting diode layer, achieving the function of resisting solar radiation, the effect of preventing the luminous efficiency and the lifespan of the organic light emitting display panel from decreasing, and improving the performance and quality of the organic light emitting display panel.

In the above-mentioned embodiments, the description of each embodiment has its own emphasis. For parts that are not described in detail in one embodiment, reference may be referred to related descriptions of other embodiments.

The organic light emitting display panel provided by the embodiments of the present application and the manufacturing method thereof are described in detail above. Specific embodiments are used in the specification to illustrate the principles and implementations of the present application. The description of the above embodiments is only for help to understand the technical solutions of the present application and its core ideas; those of ordinary skill in the art should understand that they can still modify the technical solutions described in the foregoing embodiments, or equivalently replace some of the technical features; and these modifications or the replacement does not cause the essence of the corresponding technical solutions to deviate from a scope of the technical solutions of the embodiments of the present application.

What is claimed is:

1. An organic light emitting display panel, comprising an organic light emitting diode layer and a metal nanoparticle layer in contact with external environment,
   wherein the organic light emitting diode layer comprises a first surface and a second surface oppositely disposed, and the metal nanoparticle layer is disposed on a side of the organic light emitting diode layer close to the first surface;
   wherein the organic light emitting display panel further comprises a polarizer disposed on the first surface; and the metal nanoparticle layer is disposed on a side of the polarizer away from the organic light emitting diode layer;
   wherein the organic light emitting display panel further comprises a light-transmitting layer disposed on the side of the polarizer away from the organic light emitting diode layer, and a material of the light-transmitting layer is lithium fluoride; and
   wherein a particle size of metal nanoparticles in the metal nanoparticle layer ranges from 73.5 nm to 108.6 nm.

2. The organic light emitting display panel according to claim 1,
   wherein the metal nanoparticle layer is disposed on a side of the light-transmitting layer away from the organic light emitting diode layer.

3. The organic light emitting display panel according to claim 1,
   wherein the metal nanoparticle layer is disposed in the light-transmitting layer.

4. The organic light emitting display panel according to claim 2, wherein a thickness of the light-transmitting layer ranges from 20 nanometers to 40 nanometers.

5. The organic light emitting display panel according to claim 2, further comprising an encapsulation layer disposed on the side of the light-transmitting layer away from the organic light emitting diode layer;
   wherein the metal nanoparticle layer is disposed on a side of the encapsulation layer away from the organic light emitting diode layer.

6. The organic light emitting display panel according to claim 2, further comprising an encapsulation layer disposed on the side of the light-transmitting layer away from the organic light emitting diode layer;
   wherein the metal nanoparticle layer is disposed in the encapsulation layer.

7. The organic light emitting display panel according to claim 5, wherein a thickness of the encapsulation layer ranges from 10 micrometers to 12 micrometers.

8. The organic light emitting display panel according to claim 1, wherein a material of the metal nanoparticle layer is selected from aluminum nanoparticle, copper nanoparticle, silver nano-ion, or zinc oxide nanoparticle.

9. The organic light emitting display panel according to claim 8, wherein a particle size of the aluminum nanoparticle ranges from 45.5 nanometers to 151.5 nanometers.

10. The organic light emitting display panel according to claim 5, wherein the organic light emitting diode layer comprises an anode layer, a hole injection layer, a hole transport layer, a light emitting layer, an electron blocking layer, an electron transport layer, an electron injection layer, and a cathode layer;
    wherein the cathode layer is disposed on a side of the polarizer away from the encapsulation layer, the electron injection layer is disposed on a side of the cathode layer away from the encapsulation layer, the electron transport layer is disposed on a side of the electron injection layer away from the encapsulation layer, the electron blocking layer is disposed on a side of the electron transport layer away from the encapsulation layer, the light emitting layer is disposed on a side of the electron blocking layer away from the encapsulation layer, the hole transport layer is disposed on a side of the light emitting layer away from the encapsulation layer, the hole injection layer is disposed on a side of the hole transport layer away from the encapsulation layer, and the anode layer is disposed on a side of the hole injection layer away from the encapsulation layer.

11. The organic light emitting display panel according to claim 10, wherein the anode layer comprises a first indium tin oxide layer, a conductive metal layer, and a second indium tin oxide layer stacked in sequence, and wherein the second indium tin oxide layer is disposed on the side of the hole injection layer away from the encapsulation layer.

12. The organic light emitting display panel according to claim 10, wherein the light emitting layer comprises a pixel light emitting layer and a cavity length adjustment layer; and wherein the pixel light emitting layer is disposed on the side of the electron blocking layer away from the encapsulation layer, and wherein the cavity length adjustment layer is disposed on a side of the pixel light emitting layer away from the encapsulation layer.

13. The organic light emitting display panel according to claim 12, wherein the pixel light emitting layer comprises a red pixel light emitting layer, a green pixel light emitting layer, and a blue pixel light emitting layer; and wherein the red pixel light emitting layer, the green pixel light emitting layer, and the blue pixel light emitting layer are sequentially arranged at intervals.

14. The organic light emitting display panel according to claim 13, wherein the cavity length adjustment layer comprises a red pixel cavity length adjustment layer, a green pixel cavity length adjustment layer, and a blue pixel cavity length adjustment layer; and wherein the red pixel cavity length adjustment layer is disposed opposite to the red pixel light emitting layer, the green pixel cavity length adjustment layer is disposed opposite to the green pixel light emitting layer, and the blue pixel cavity length adjustment layer is disposed opposite to the blue pixel light emitting layer.

15. A method of manufacturing an organic light emitting display panel, comprising:

providing an organic light emitting diode layer comprising a first surface and a second surface oppositely disposed; and forming a metal nanoparticle layer on the first surface, the metal nanoparticle layer being in contact with external environment, and a particle size of metal nanoparticles in the metal nanoparticle layer ranging from 73.5 nm to 108.6 nm;

forming a polarizer disposed on the first surface, and the metal nanoparticle layer being disposed on a side of the polarizer away from the organic light emitting diode layer; and forming a light-transmitting layer disposed on the side of the polarizer away from the organic light emitting diode layer, and a material of the light-transmitting layer is lithium fluoride.

16. The method of manufacturing the organic light emitting display panel according to claim 15, wherein the step of forming the metal nanoparticle layer on the first surface comprises:

coating a layer of metal nanoparticles on the first surface by spin coating process; and forming the metal nanoparticle layer by the metal nanoparticles.

17. The method of manufacturing the organic light emitting display panel according to claim 16, wherein the step of forming the metal nanoparticle layer on the first surface comprises:

vacuum vapor-depositing a layer of metal nanoparticles on the first surface by vacuum evaporation process; and forming the metal nanoparticle layer by the metal nanoparticles.

18. The method of manufacturing the organic light emitting display panel according to claim 16, wherein the metal nanoparticle layer is made of aluminum nanoparticle, copper nanoparticle, silver nano-ion, or zinc oxide nanoparticle.

19. The method of manufacturing the organic light emitting display panel according to claim 18, wherein a particle size of the aluminum nanoparticle ranges from 45.5 nanometers to 151.5 nanometers.

\* \* \* \* \*